(12) United States Patent
Yang

(10) Patent No.: US 6,238,984 B1  
(45) Date of Patent: May 29, 2001

(54) INTEGRATING HIGH VOLTAGE AND LOW VOLTAGE DEVICE WITH SILICIDE BLOCK MASK

(75) Inventor: Sheng-Hsiung Yang, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/565,783

(22) Filed: May 5, 2000

(51) Int. Cl.$^7$ ................................. H01L 21/8234
(52) U.S. Cl. ................ 438/275; 438/683; 438/656; 438/655
(58) Field of Search .................... 438/199, 275, 438/308, 592, 655, 656, 657, 683

(56) References Cited

U.S. PATENT DOCUMENTS 5,888,869 * 3/1999 Cho et al. .................. 438/275
6,110,782 * 8/2000 Chu et al. .................. 438/275

FOREIGN PATENT DOCUMENTS

928030 * 7/1999 (EP).

* cited by examiner

Primary Examiner—Trung Dang

(57) ABSTRACT

A method for forming a high voltage and low voltage device is disclosed. According to the process, by the protection of the photoresist, the cap oxide layer on a high voltage device will not be removed in the dry etching process, and with the isolaton of cap oxide layer, the metal layer will not react on high voltage device to produce metal silicide. Accordingly, the high voltage device will not be spoiled by the silicide. The method tolerates normal silicide process, and high current feature of low voltage logic device. In addition, the prior cell library is still suitable for this process.

17 Claims, 5 Drawing Sheets

INTEGRATING HIGH VOLTAGE AND LOW VOLTAGE DEVICE WITH SILICIDE BLOCK MASK

BACKGROUND OF THE INVENTION

1. Field of the Invention

The present invention generally relates to the field of the semiconductor device, and more particularly, to high voltage and low voltage devices.

2. Description of the Prior Art

Generally, there exists a trend in the field of ultra large scale integration to integrate different types of electric devices. We will suffer some issues while integrating these devices, and we have to solve these problems.

If we apply the conventional silicide process to the integration process of high voltage and low voltage devices, silicide such as titanium silicide ($TiSi_2$) will be produced on the source/drain region of the devices. The titanium silicide does not affect the low voltage device. However, the higher electric resist resulting from titanium silicide will reduce the current of the device, and will spoil the device.

Besides, if we apply the polycide process to integrate the high voltage and low voltage devices, the high voltage device will not be affected, but the feature of low voltage logic device will be spoiled. And more particularly, in such process, we cannot use the prior cell library any more.

Consequently, it is an important issue to integrate high voltage and low voltage devices. It is important that, in the integration process, we keep using the cell library established before, and maintain the function of the high voltage device.

SUMMARY OF THE INVENTION

In accordance with the present invention, a method is provided for integrating the process of high voltage and low voltage devices. The process contains silicide processes of high voltage device, and maintains the function of high voltage device.

It is another object of this invention to integrate the process of high voltage and low voltage devices. The process maintains the high current feature of low voltage device and keeps on using the prior cell library.

In one embodiment, we provide a process of high voltage and low voltage devices. A cap oxide is formed after implanting the source and drain during the process. Then, a photoresist is formed to cover the cap oxide on a high voltage device. With the protection of the photoresist, the cap oxide on the high voltage device will not be removed at the next dry etching step. The photoresist covering the cap oxide on high voltage device is thereafter removed. After removing the photoresist, a metal layer such as a titanium (Ti) layer is formed on high voltage and low voltage devices individually. Silicide region will be formed on the low voltage device but not on the high voltage device because of the isolation by the cap oxide layer. Finally, the unreacted metal is removed and an inter-layer dielectric layer is formed on the high voltage and the low voltage devices.

According to the former statement, we can integrate a process of high voltage and low voltage devices. We can maintain the function of high voltage device and maintain the property of high current in the process. Besides, we can still apply the prior cell library in such a process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
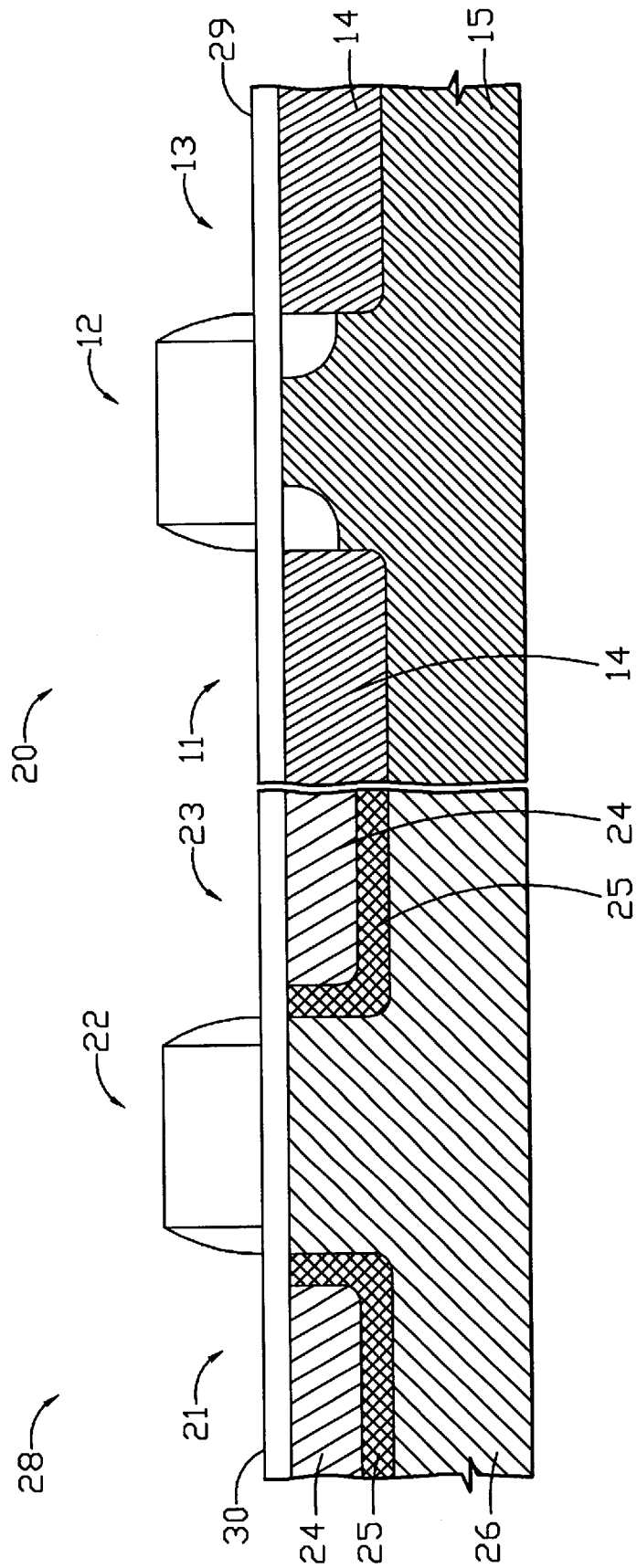
FIG. 1 is a cross-sectional view of a high voltage and low voltage device, wherein the left side indicates the high voltage device and the right side indicates the low voltage device.

FIG. 1 shows a cross-sectional view of a low voltage NMOS 20 and a high voltage NMOS 28. In the low voltage NMOS 20, 11, 12, 13 indicate source, gate and drain of device individually, and they are formed on gate oxide 29 of device. There is a $N^+$ region 14 and a P type region 15 in the low voltage device. Reference numerals 21, 22, 23 indicate source, gate and drain of high voltage NMOS device 28 individually, and they are formed on gate oxide 30 of device. There is a $N^+$ region 24 and a P type region 26 in the high voltage device. Besides, the figure also shows a light doping N channel region 25.

Figure 2:
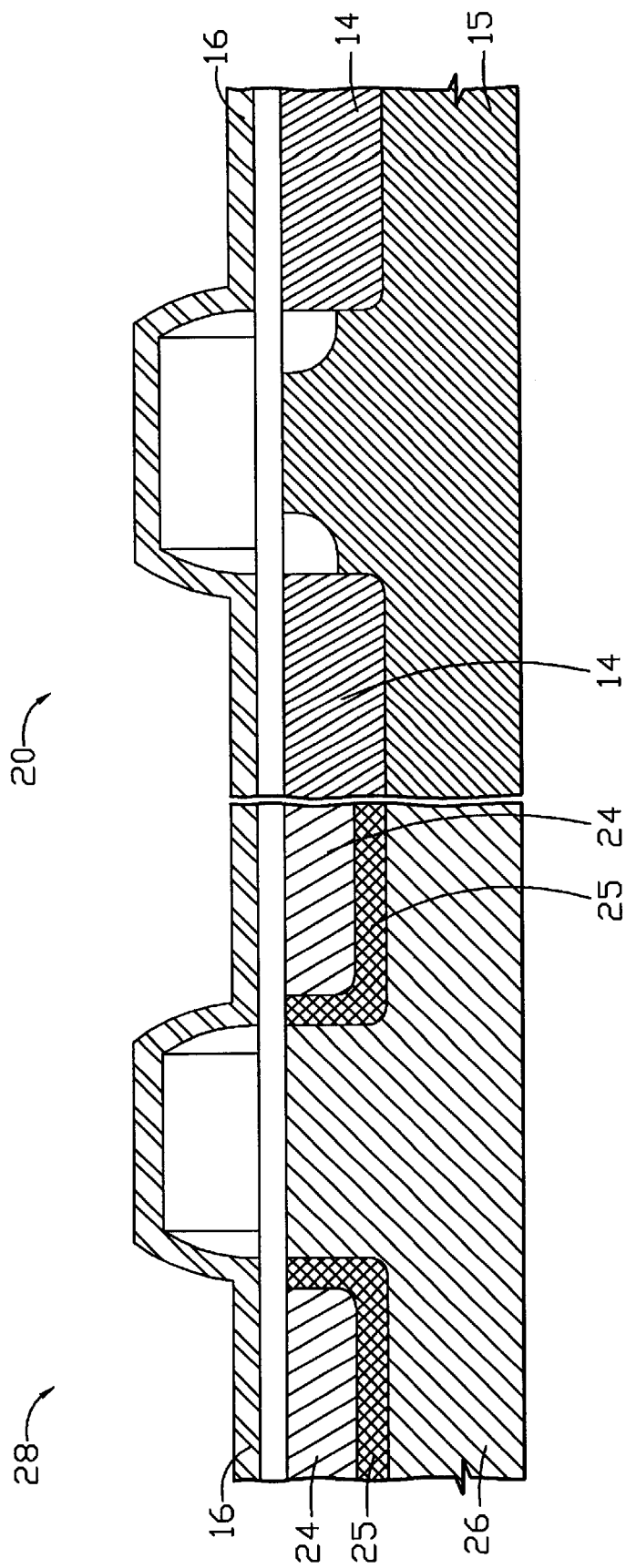
FIG. 2 is a cross-sectional view illustrating the step of forming a cap oxide on the surfaces of high voltage metal oxide semiconductor device and low voltage metal oxide semiconductor device.

As shown in FIG. 2, after implanting source/drain (11,13) of the low voltage NMOS device 20 and source/drain (21,23) of the high voltage NMOS device 28, an anneal process is executed. A cap oxide 16 is then formed which is about 500 Å in thickness on the low voltage NMOS device 20 and on the high voltage NMOS device 28.

Figure 3:
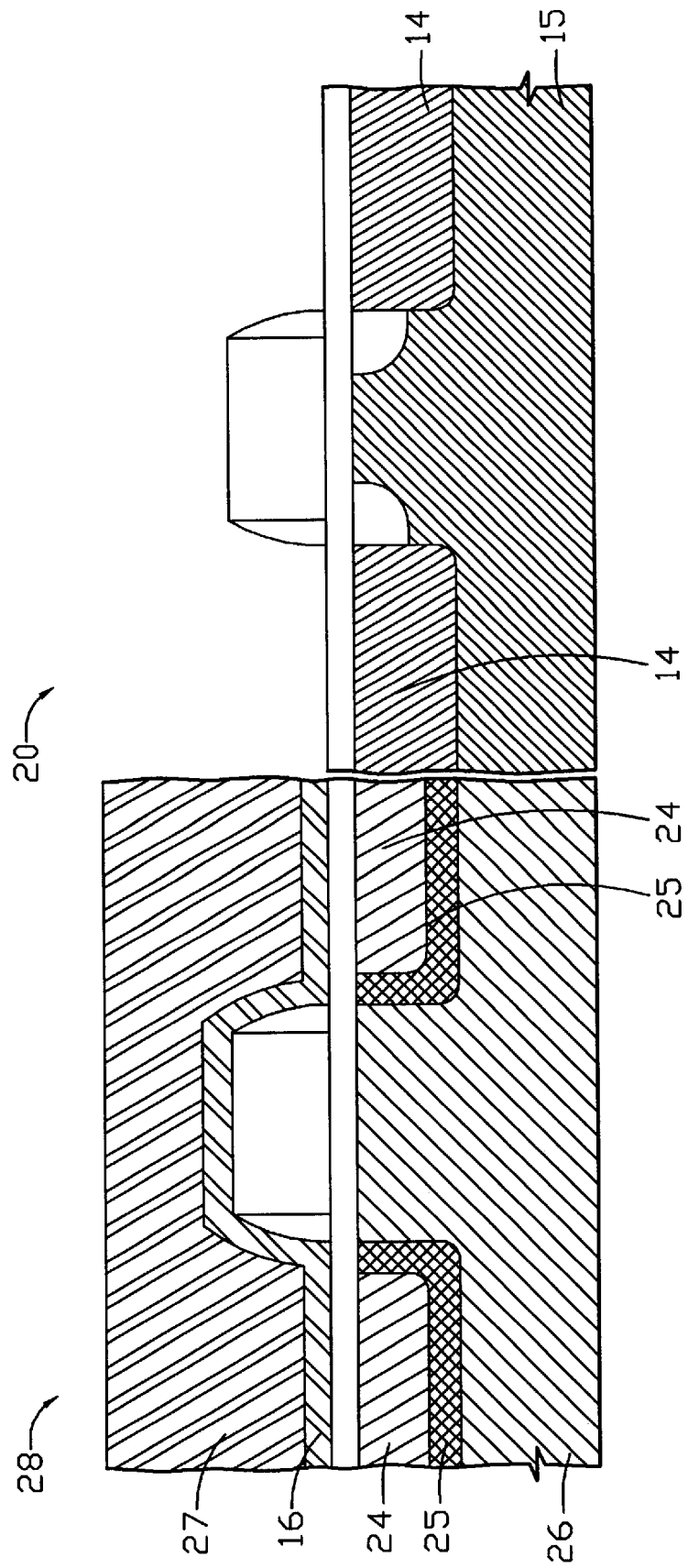
FIG. 3 is a cross-sectional view illustrating the step of forming a photoresist layer on a high voltage device.

As shown in FIG. 3, a photoresist layer 27 is formed to cover the cap oxide 16 of the high voltage NMOS device 28.

Figure 4:
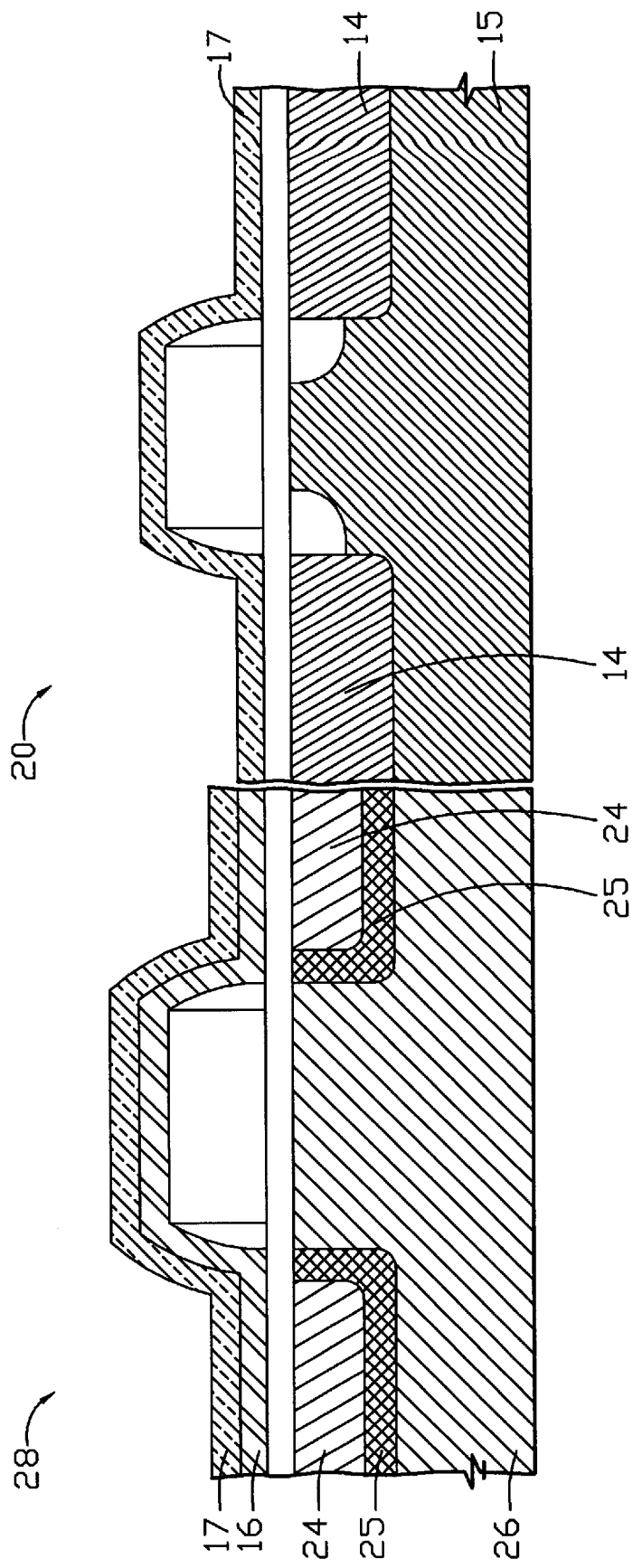
FIG. 4 is a cross-sectional view illustrating the step of removing cap oxide on low voltage device, and then removing photoresist on a high voltage device, and forming a titanium layer on the high voltage and the low voltage devices.

As shown in FIG. 4, the cap oxide 16 of the low voltage NMOS device 20 is removed by dry etching. Photoresist layer 27 on the high voltage NMOS device 28 is then removed. Consequently, forming a titanium layer which is about 2400 Å in thickness on the low voltage NMOS device 20 and on the cap oxide 16 of high voltage NMOS device 28.

Figure 5:
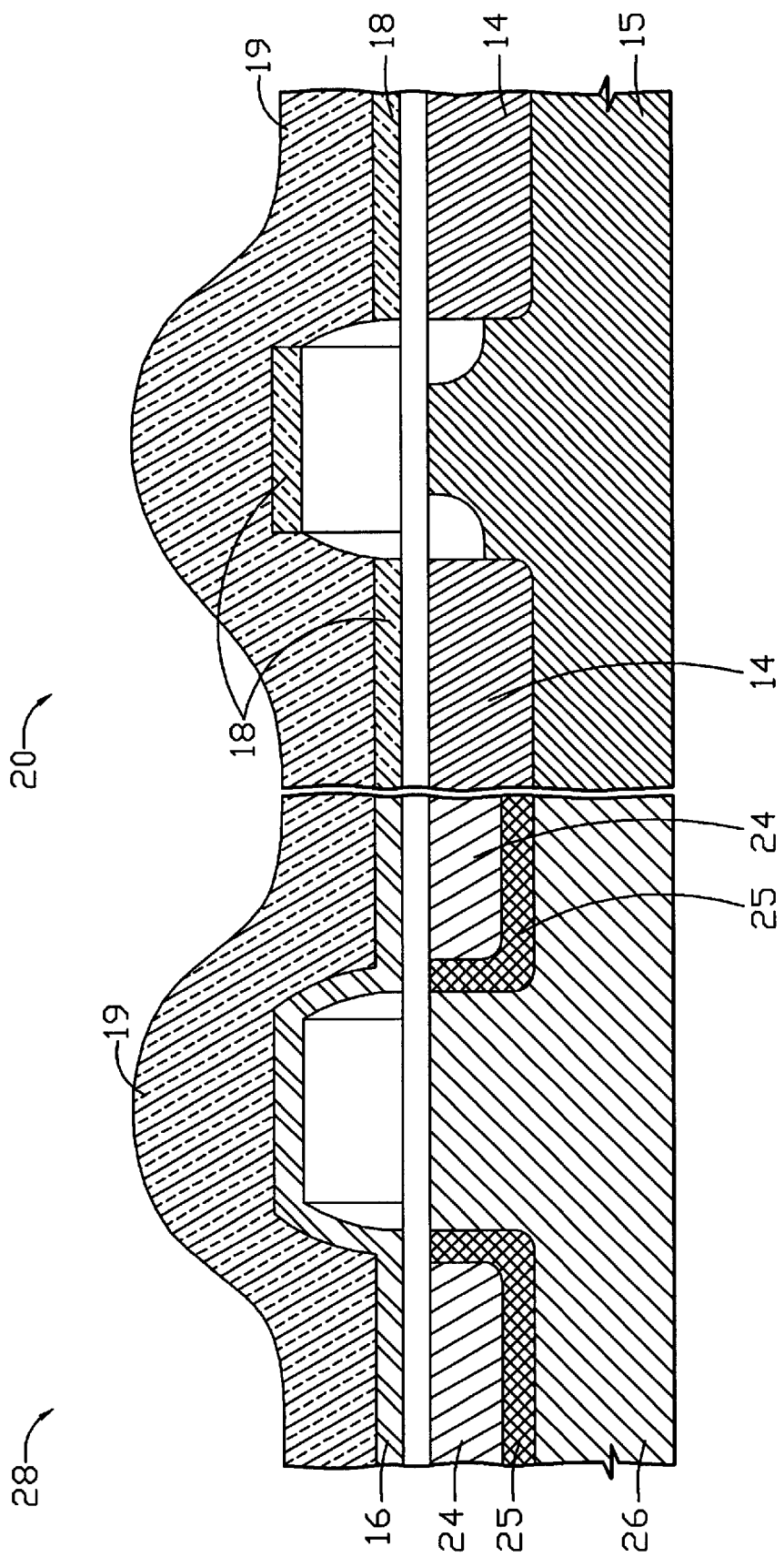
FIG. 5 is a cross-sectional view illustrating the step of removing the titanium layer on the high voltage and the low voltage device, and then forming an inter-layer dielectric on the high voltage and the low voltage device.

Finally, as FIG. 5 shows, after executing rapidly thermal process (RTP), unreacted titanium layer 17 on the low voltage NMOS device 20 and on the cap oxide 16 of high voltage NMOS device 28 is removed. The titanium layer 17 does not react on the high voltage NMOS device 28 and thereof does not form a titanium silicide ($TiSi_2$) 18 on the high voltage NMOS device 28. The rapidly thermal process includes firstly heating the titanium layer 17 and then cleaning by RCA process, and secondly applying a heating treatment. Finally, an inter-layer dielectric layer 19 on low voltage NMOS device 20 and on cap oxide 16 of high voltage NMOS device 28 is formed.

Although specific embodiments have been illustrated and described, it will be obvious to those skilled in the art that various modifications may be made without departing from what is intended to be limited solely by the appended claims.

What is claimed is:

1. A method for integrating high voltage and low voltage device, wherein method comprises:

providing a substrate having a low voltage MOS device and a high voltage MOS device;

forming a source/drain region on said low voltage MOS device and said high voltage MOS device;

annealing said low voltage MOS device and said high voltage MOS device;

forming a cap oxide layer on said low voltage MOS device and said high voltage MOS device;

forming a photoresist layer to cover said cap oxide layer of said high voltage MOS device;

removing said cap oxide layer on said low voltage MOS device by using said photoresist layer as a mask;

removing said photoresist layer;

forming a metal layer on said cap oxide layer of said high voltage MOS device and on surface of said low voltage MOS device;

thermally treating said metal layer by rapidly thermal process, consequently forming a metal silicide layer on surface of said low voltage device; and forming an inter-layer dielectric layer on said cap oxide layer of said high voltage MOS device and on surface of said low voltage MOS device.

2. The method of claim 1, wherein said low voltage MOS device is N type.

3. The method of claim 1, wherein said low voltage MOS device is P type.

4. The method of claim 1, wherein said high voltage MOS device is N type.

5. The method of claim 1, wherein said high voltage MOS device is P type.

6. The method of claim 1, wherein said cap oxide layer is forming on said low voltage MOS device.

7. The method of claim 6, wherein said cap oxide is about 500 Å in thickness.

8. The method of claim 1, wherein said cap oxide layer is formed on said high voltage MOS device.

9. The method of claim 8, wherein said cap oxide layer is about 500 Å in thickness.

10. The method of claim 1, wherein said metal layer is titanium layer.

11. The method of claim 10, wherein said titanium layer is abaout 2400 Å in thickness.

12. The method of claim 1, wherein said rapidly thermal process comprises: first rapidly heating to react said metal layer, cleaning with RCA to remove unreacted metal layer, second heating the reacted metal layer.

13. A method for integrating high voltage and low voltage device, wherein method comprises:

providing a said substrate having a said low voltage MOS device and a said high voltage MOS device;

forming a source/drain region on said low voltage MOS device and said high voltage MOS device individually;

annealing said low voltage MOS device and said high voltage MOS device;

forming a cap oxide layer on said low voltage MOS device and on said high voltage MOS device;

forming a photoresist layer to cover said cap oxide layer of said high voltage MOS device;

removing said cap oxide layer on said low voltage MOS device by using said photoresist layer as a mask;

removing said photo resistlayer;

forming a metal layer on said cap oxide of said high voltage MOS device and on surface of said low voltage MOS device;

thermally heating said metal layer by rapidly thermal process, consequently forming a metal silicide layer on surface of said low voltage device; and forming an inter-layer dielectric layer on said cap oxide of said high voltage MOS device and on surface of said low voltage MOS device.

14. The method of claim 13, wherein said removing said cap oxide is using dry etching.

15. The method of claim 13, wherein said forming a photo resist layer is to protect said cap oxide of said high voltage MOS device from etching by dry etching process.

16. The method of claim 13, wherein said forming a said metal layer is to form a said titanium layer.

17. The method of claim 13, wherein said forming a said titanium layer on said low voltage MOS device will produce a titanium silicide layer in the thermal process.

* * * * *